(12) United States Patent
Gonzalez et al.

(10) Patent No.: US 11,294,408 B2
(45) Date of Patent: Apr. 5, 2022

(54) TEMPERATURE COMPENSATION FOR SILICON RESISTOR USING INTERCONNECT METAL

(71) Applicant: NXP USA, Inc., Austin, TX (US)

(72) Inventors: Octavio A. Gonzalez, Pflugerville, TX (US); Charles Eric Seaberg, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/999,197

(22) Filed: Aug. 21, 2020

(65) Prior Publication Data

US 2022/0057818 A1 Feb. 24, 2022

(51) Int. Cl.
*G01R 1/44* (2006.01)
*G05D 23/24* (2006.01)
*G01R 1/20* (2006.01)
*H01C 7/06* (2006.01)
*H01C 17/00* (2006.01)

(52) U.S. Cl.
CPC ............. *G05D 23/24* (2013.01); *G01R 1/203* (2013.01); *G01R 1/44* (2013.01); *H01C 7/06* (2013.01); *H01C 17/006* (2013.01)

(58) Field of Classification Search
None
See application file for complete search history.

(56) References Cited

U.S. PATENT DOCUMENTS

| 6,147,481 | A | * | 11/2000 | Mazzochette | G01R 21/04 324/106 |
| 6,646,539 | B2 | | 11/2003 | Bloch | |
| 7,253,074 | B2 | | 8/2007 | Park | |
| 8,093,956 | B2 | | 1/2012 | Feng et al. | |
| 2005/0200451 | A1 | * | 9/2005 | Tsukada | H01C 17/28 338/309 |
| 2010/0259315 | A1 | | 10/2010 | Lin | |
| 2015/0077214 | A1 | * | 3/2015 | Gobbi | H01C 17/232 338/9 |
| 2016/0155547 | A1 | * | 6/2016 | Yuan | H01C 7/006 338/9 |

FOREIGN PATENT DOCUMENTS

DE     102011100250 B4     9/2014

* cited by examiner

*Primary Examiner* — Jas A Sanghera

(57) ABSTRACT

An integrated circuit that can include a driver having a first driver output, and a first resistance coupled between a first node coupled to the first driver output and a second node. The first resistance can include a process resistor including a first material having a first temperature coefficient, and an interconnect resistor configured to provide at least 20% of the first resistance and including a second material having a second temperature coefficient which changes resistance in an opposite direction with temperature as compared to the first temperature coefficient. A first terminal of the interconnect resistor is directly connected to a first terminal of the process resistor.

19 Claims, 3 Drawing Sheets

FIG. 1

TEMPERATURE COMPENSATION FOR SILICON RESISTOR USING INTERCONNECT METAL

BACKGROUND

Field

This disclosure relates generally to semiconductor devices, and more specifically, to temperature compensation for silicon resistors.

Related Art

Performance variability in semiconductor devices is often referred to as Process, Voltage, and Temperature (PVT) variations. Amongst the biggest causes of variation is temperature. In integrated circuits, temperature can cause a circuit to differ in characteristics such as switching speeds due to the change in electron mobility and can change the expected behavior of discrete components and sensors. For these reasons many systems can benefit from adding components to the design to compensate for temperature variations. Temperature compensation components must, in most cases, be small and low cost.

The negative temperature coefficient of silicon dopant resistors integrated circuit devices typically creates challenges in circuits and systems that require a flat temperature coefficient. Circuits such as voltage/bias reference networks and PHY transmitters/receivers have been required to use at least one of several options to achieve compensate the temperature coefficient, including additional circuitry, more complicated circuitry, and/or relying on external precision components. All of these options lead to higher system cost either through area, test, pin-out, and/or external components.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1 illustrates a schematic diagram of an integrated circuit device with temperature compensated termination resistors in accordance with selected embodiments of the present invention.

DETAILED DESCRIPTION

Figure 2:
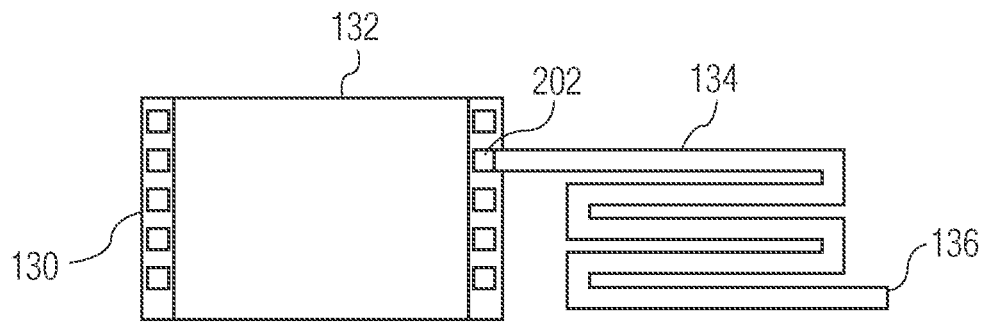
FIG. 2 illustrates a top view of an example of a layout for a process resistor coupled to an interconnect resistor in the integrated circuit device of FIG. 1.

Embodiments of integrated circuit devices are provided that combine an interconnect resistor having a resistance that decreases as temperature increases with a process resistor having a resistance that increases as temperature increases. The combination provides a temperature-compensated resistance with a neutral or flat temperature coefficient. Further, the temperature-compensated resistance is produced using components that are already in place in the design, thereby eliminating the need for additional components that would increase cost, space requirements, and complexity. The resulting temperature-compensated resistance can be used in voltage/current reference circuits, termination circuits for physical layer devices (PHYs) and other integrated circuit blocks. The combination of the resistors having resistance vs. temperature curves with opposite slopes can be connected in series, parallel or a combination of series and parallel. Area optimization can be accomplished by stacking the interconnect resistor on top of the process resistor.

As used herein, the term "process resistor" refers to a resistor that is fabricated using chemical processes such as diffusion and implantation in and onto the surface of a semiconductor material such as silicon while forming an array of electric circuits of an integrated circuit device. Process resistors and other electric devices such as transistors, capacitors, inductors are formed during front-end-of-line processes. Process resistors can be formed using polysilicon, a semiconductor well region of the integrated circuit, or a diffusion region of the integrated circuit. The term "interconnect resistor" refers to a resistor that is formed using interconnect material in one or more interconnect layers of a semiconductor device. The interconnect layers include lines or wires of conductive material that are formed on and routed through layers of dielectric material to connect the electric circuits on the substrate to each other to distribute signals. The interconnect resistors and wiring to connect the electric devices such as resistors, transistors, capacitors, and inductors, are formed during back-end-of-line processes.

Figure 1:
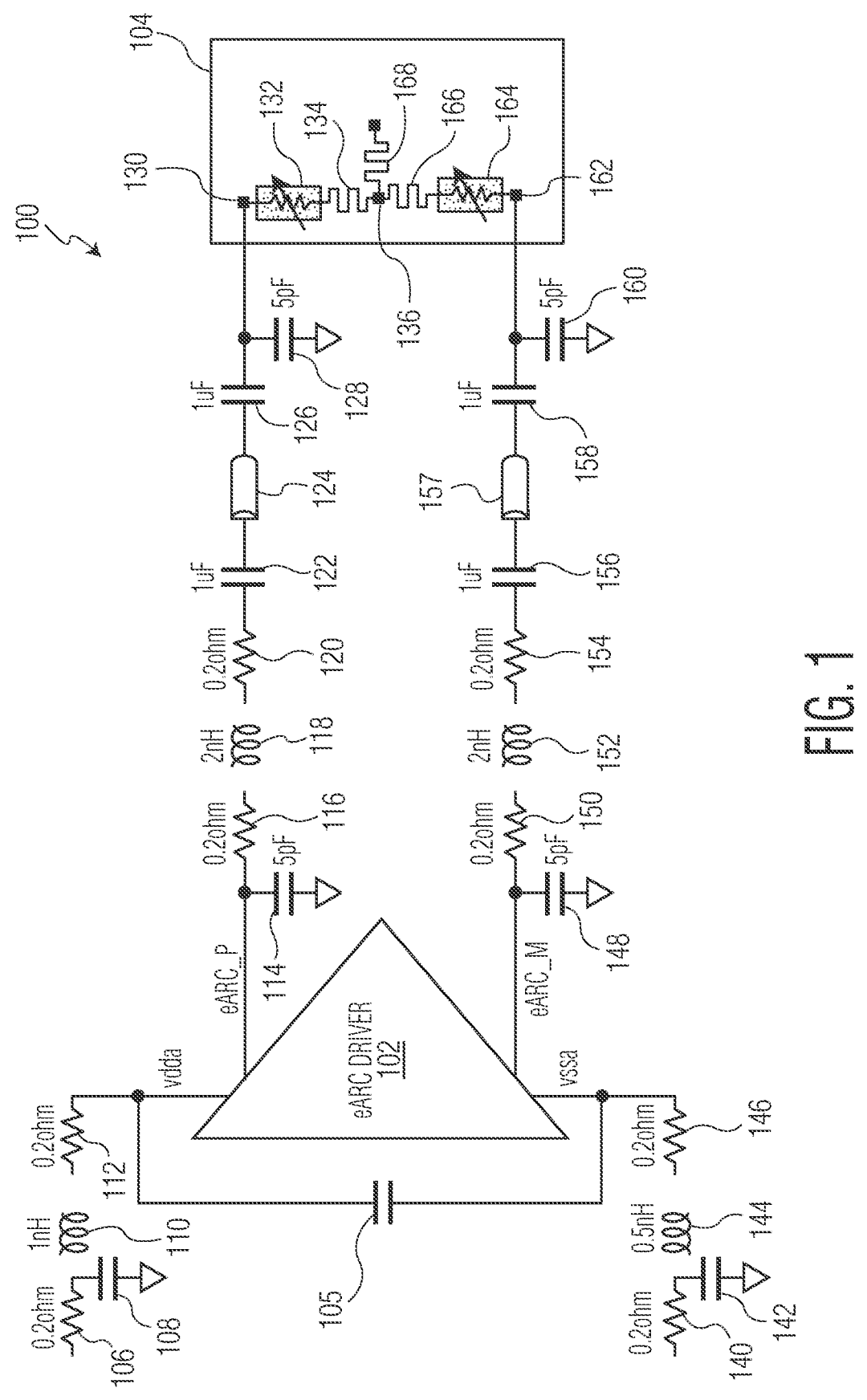

FIG. 1 illustrates a schematic diagram of integrated circuit (IC) devices 100 with temperature compensated termination resistors 132, 164 in accordance with selected embodiments of the present invention. IC device 100 includes differential driver circuit 102 that can be used in a transceiver for a PHY device that implements physical layer functions of the Open Systems Interconnection model (OSI model) in a network interface controller. Driver circuit 102 is coupled to temperature-compensated termination resistor circuitry 104 to prevent reflections in the signal due to the impedance characteristics of the lines connected to the differential outputs of driver circuit 102. Due to the temperature compensation from interconnect resistors 134, 166, 168, termination resistor circuitry 104 is effective over a wide range of temperatures, as will be further described herein.

Capacitor 105 has a first terminal connected to a first input (VDDA) of driver circuit 102 and a second terminal coupled to a second input (VSSA) of driver circuit 102.

The first input (VDDA) of driver circuit 102 is also coupled to a low pass filter including resistor 106, capacitor 108, inductor 110 and resistor 112. Resistor 106, inductor 110 and resistor 112 are coupled in series to one another with a terminal of resistor 112 coupled to the first input of driver circuit 102. Capacitor 108 includes a first terminal coupled to a line connecting resistor 106 in series with inductor 110 and a second terminal coupled to ground.

A first output of driver circuit 102 is connected to signal filtering and conditioning components including capacitor 114, resistor 116, inductor 118, resistor 120 capacitor 122, transmission line channel 124, and capacitors 126 and 128. Capacitor 114 includes a first terminal connected to a line between the first output of driver circuit 102 and resistor 116, and a second terminal coupled to ground.

Resistor 116, inductor 118, resistor 120 capacitor 122, transmission line channel 124 and capacitor 126 are coupled in series starting with a terminal of resistor 116 connected to the first output of driver circuit 102 and ending with a terminal of capacitor 126 connected to a first input to termination resistor circuitry 104 at node 130. Capacitor 128 includes a first terminal coupled to a line connecting capacitor 126 to node 130 of termination resistor circuitry 104 and a second terminal coupled to ground.

The second input (VSSA) of driver circuit 102 is also coupled to a low pass filter including resistor 140, capacitor 142, inductor 144 and resistor 146. Resistor 140, inductor 144 and resistor 146 are coupled in series to one another with a terminal of resistor 146 coupled to the second input of driver circuit 102. Capacitor 142 includes a first terminal coupled to a line connecting resistor 140 in series with inductor 144 and a second terminal coupled to ground.

A second output of driver circuit 102 is connected to signal filtering and conditioning components including capacitor 148, resistor 150, inductor 152, resistor 154 capacitor 156, transmission line channel 157, and capacitors 158 and 160. Capacitor 148 includes a first terminal connected to a line between the second output of driver circuit 102 and resistor 150, and a second terminal coupled to ground.

Resistor 150, inductor 152, resistor 154 capacitor 156, transmission line channel 157 and capacitors 158 are coupled in series starting with a terminal of resistor 150 connected to the second output of driver circuit 102 and ending with a terminal of capacitor 158 connected to a second input to termination resistor circuitry 104 at node 162. Capacitor 160 includes a first terminal coupled to a line connecting capacitor 158 to node 162 termination resistor circuitry 104 and a second terminal coupled to ground.

Termination resistor circuitry 104 include process resistor 132 with a first terminal connected to node 130 and a second terminal connected to a first terminal of interconnect resistor 134. A second terminal of interconnect resistor 134 is connected at common node 136 to a first terminal of interconnect resistor 166 and a first terminal of interconnect resistor 168. A second terminal of resistor 166 is connected to a first terminal of process resistor 164. A second terminal of process resistor 164 is connected to node 162. Resistor 168 is a common mode resistor with the first terminal connected to the second terminal of interconnect resistor 134 and the first terminal of interconnect resistor 166. Driver circuit 102 has both differential and common mode termination specifications, so termination resistor circuitry 104 includes process resistors 132, 164 and interconnect resistor 168 in addition to interconnect resistors 134, 166 to terminate the differential and common mode lines.

Process resistors 132 and 164 can be variable resistors formed by combining non-variable resistors in parallel or in series. Process resistors 132, 164, and interconnect resistors 134, 166 and 168 are connected so that process resistors 132 and 164 have minimum change with temperature.

IC device 100 is shown as an example one use for termination resistor circuitry 104, which consistently reduces/prevents signals at nodes 130, 162 from reflecting back onto the transmission line over a wide range of temperatures. Further, interconnect resistors 134, 168, 166 are formed in metal layers adjacent to a substrate in which process resistors 132, 164 are formed using fabrication methods already being employed. It is typically desired to make interconnections between circuit components as short as possible to minimize parasitic resistance to less than 1 percent of the total resistance of termination resistors. In termination resistor circuitry 104, however, interconnect resistors 134, 164, 168 take the place of shorter interconnect wires and are designed to provide 5-30 percent of the total resistance of termination resistor circuitry 104. In some embodiments, interconnect resistors 134, 166, 168 provide 20% of the total resistance of termination resistor circuitry 104.

To achieve the desired resistance to compensate for temperature variations of process resistor 132, the thickness and length of interconnect resistors 134, 164, 168 can be increased compared to dimensions of interconnects typically used in such circuits. Temperature compensation is thus achieved for process resistors 132, 164 using front-end-of-line and back-end-of-line fabrication processes and components that are already used to connect process resistors 132, 164 to common node 136, and to connect common node 136 to other integrated circuit components (not shown).

Any suitable type of interconnect material that has resistance versus temperature characteristics that are opposite the resistance versus temperature characteristics of process resistors 132, 164 can be used. For example, when process resistors 132, 164 are formed in silicon or germanium, suitable materials for interconnect resistors 134, 166, 168 include any conductive metal, such as high K metal.

Note that instead of using differential driver circuit 102, a single-ended drive circuit (not shown) that only requires process resistor 132 connected to interconnect resistor 134 at one end, and the other end of interconnect resistor 134 coupled to ground. No common mode resistor 168 would be required in such an embodiment.

FIG. 2 illustrates a top view of an example of process resistor 132 coupled to interconnect resistor 134 in IC device 100 of FIG. 1. One terminal or end of process resistor 132 is connected at node 130 and another terminal or end of process resistor 132 is connected to a first terminal of interconnect resistor 134 at node 202. A second terminal of interconnect resistor 134 will connect to node 136. Interconnect resistor 134 is formed off to one side of process resistor 132 to show which component forms process resistor 132 and which component forms interconnect resistor 134. Process resistor 132 is formed in a semiconductor substrate that is subjected to chemical processes such as doping and diffusion. Interconnect resistor 134 is formed of a single line of material that may include a series of switchbacks, or back and forth routing, in one or more interconnect layers formed by tracings of conductive material between layers of dielectric material (not shown). Process resistors 132, 164 are coupled to other elements (not shown) using interconnect material. Temperature compensation using interconnect resistors 134, 166, 168 can be achieved when more than a typical or minimum amount of interconnect metal is used for interconnect resistors 134, 166, 168.

Figure 3:
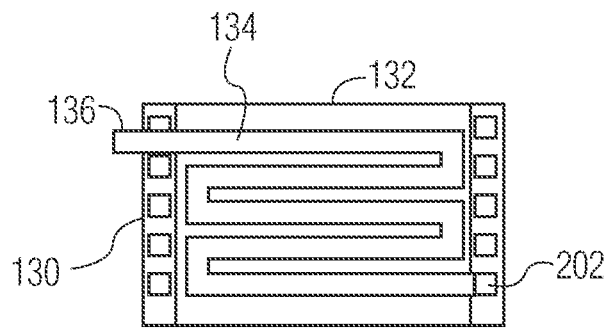
FIG. 3 illustrates a top view of another example of a layout for a process resistor coupled to an interconnect resistor in the integrated circuit device of FIG. 1.

FIG. 3 illustrates a top view of another example of a process resistor 132 coupled to interconnect resistor 134 in IC device 100 of FIG. 1 in which interconnect resistor 134 is formed in interconnect layers above the substrate in which process resistor 132 is formed to save space. Instead of spreading horizontally, the example in FIG. 3 stacks interconnect resistor 134 vertically over process resistor 132. Again, interconnect resistor 134 may be formed of a single line of material that may include a series of switchbacks, or back and forth routing, in one or more interconnect layers formed by tracings of conductive material between layers of dielectric material (not shown).

Figure 4:
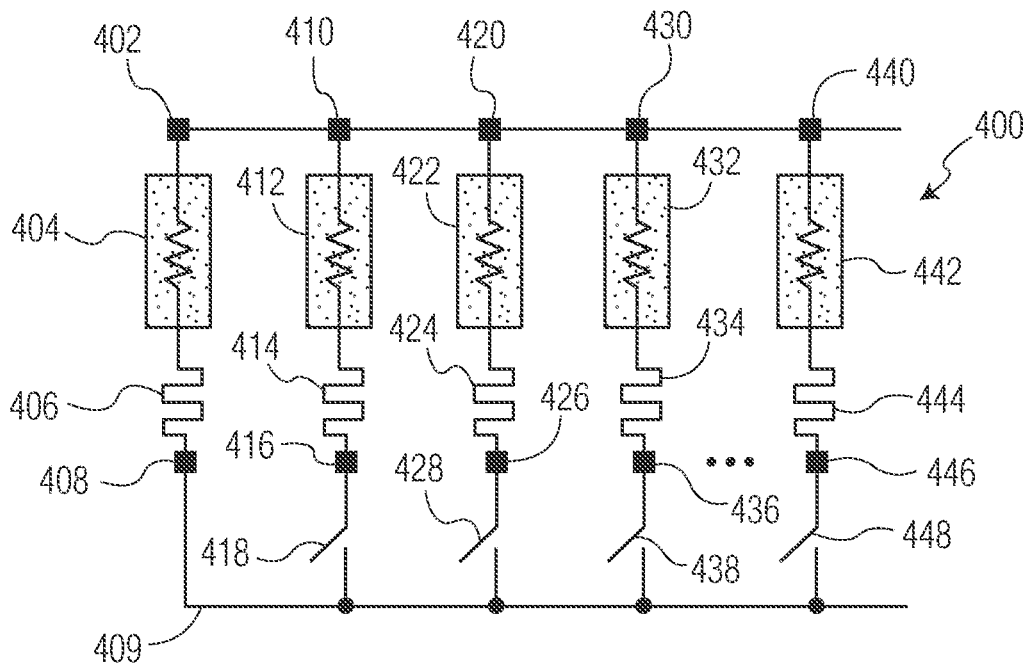
FIG. 4 illustrates a set of process resistors with corresponding interconnect resistors coupled in parallel in accordance with selected embodiments of the present invention.

FIG. 4 illustrates programmable resistance circuit 400 that includes process resistors 404, 412, 422, 432, 442 (collectively, process resistors 404-442), interconnect resistors 406, 414, 424, 434, 444 (collectively, interconnect resistors 406-444), and switches 418, 428, 438, 448. Process resistors 404-442 are similar to process resistors 132, 164 of FIGS. 1, 2, and 3. Interconnect resistors 406-444 are similar to interconnect resistors 134, 166 of FIGS. 1, 2, and 3.

Programmable resistance circuit 400 is shown with five parallel branches, with each branch including a process resistor connected in series with an interconnect resistor. Four of the five branches include a switch connected in series with the process resistor and the interconnect resistor. The switches may be opened or closed to vary the level of temperature-compensated resistance.

Nodes 402, 410, 420, 430, 440 are tied together at a top side of programmable resistance circuit 400. A first branch of programmable resistance circuit 400 includes process resistor 404 and interconnect resistor 406 connected in series between nodes 402 and 408. Node 408 is connected to conductive line 409, which ties the parallel branches of programmable resistance circuit 400 together on a bottom side.

A second branch of programmable resistance circuit 400 includes process resistor 412 and interconnect resistor 414 connected in series between nodes 410 and 416. Switch 418 is connected in series with process resistor 412 and interconnect resistor 414 with one terminal connected to node 416 and another terminal connected to conductive line 409.

A third branch of programmable resistance circuit 400 includes process resistor 422 and interconnect resistor 424 connected in series between nodes 420 and 426. Switch 428 is connected in series with process resistor 422 and interconnect resistor 424 with one terminal connected to node 426 and another terminal connected to conductive line 409.

A fourth branch of programmable resistance circuit 400 includes process resistor 432 and interconnect resistor 434 connected in series between nodes 430 and 436. Switch 438 is connected in series with process resistor 432 and interconnect resistor 434 with one terminal connected to node 436 and another terminal connected to conductive line 409.

A fifth branch of programmable resistance circuit 400 includes process resistor 442 and interconnect resistor 444 connected in series between nodes 440 and 446. Switch 448 is connected in series with process resistor 442 and interconnect resistor 444 with one terminal connected to node 446 and another terminal connected to conductive line 409.

Figure 5:
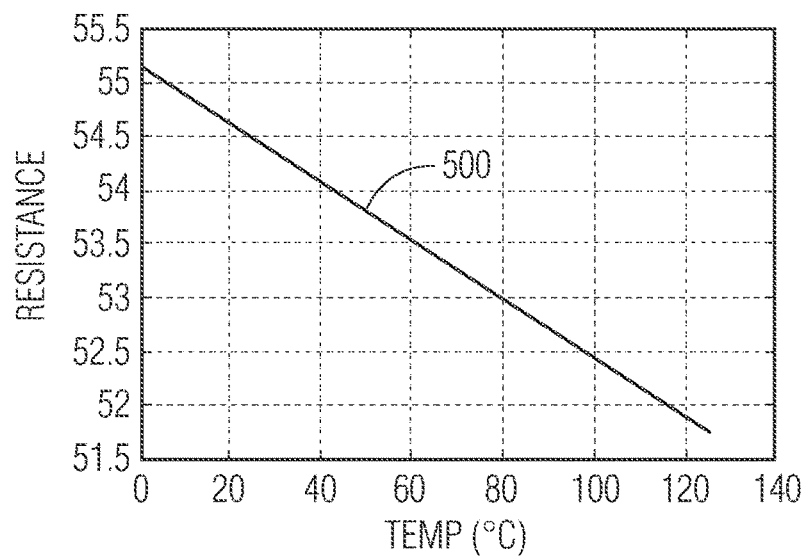
FIG. 5 illustrates an example of a resistance versus temperature curve for a process resistor.

FIG. 5 illustrates an example of a resistance versus temperature curve 500 for process resistors 132, 164 of FIG. 1. The material of which process resistors 132, 164 are made has a negative temperature coefficient, indicated by curve 500 showing resistance decreasing as temperature increases. In the example of FIG. 5, the resistance at zero degrees Celsius is approximately 55.15 ohms and varies linearly to a resistance of approximately 51.7 ohms at approximately 125 degrees Celsius.

Figure 6:
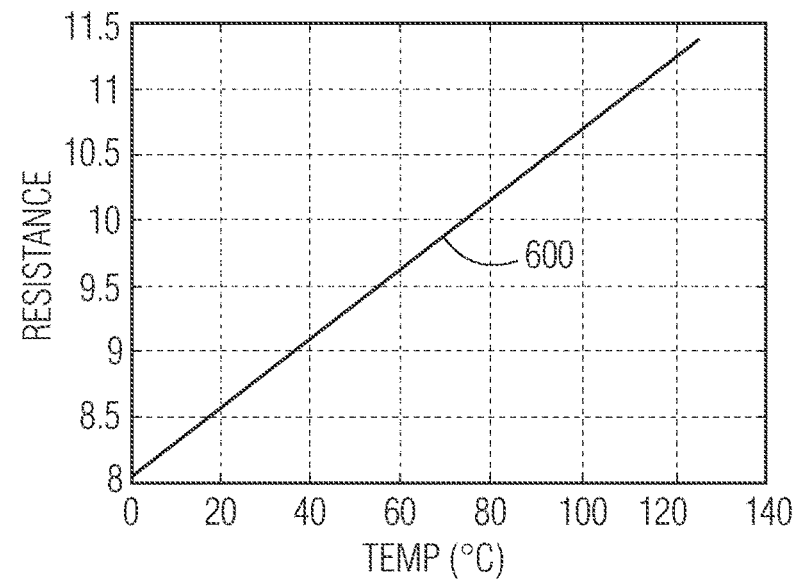
FIG. 6 illustrates an example of a resistance versus temperature curve for an interconnect resistor.

FIG. 6 illustrates an example of a resistance versus temperature curve 600 for interconnect resistors 134, 166, 168 of FIG. 1. The material of which interconnect resistors 134, 166, 168 are made has a positive temperature coefficient, indicated by curve 600 showing resistance increasing as temperature increases. In the example of FIG. 6, the resistance at zero degrees Celsius is approximately 8 ohms and varies linearly to a resistance of approximately 11.4 ohms at approximately 125 degrees Celsius.

Figure 7:
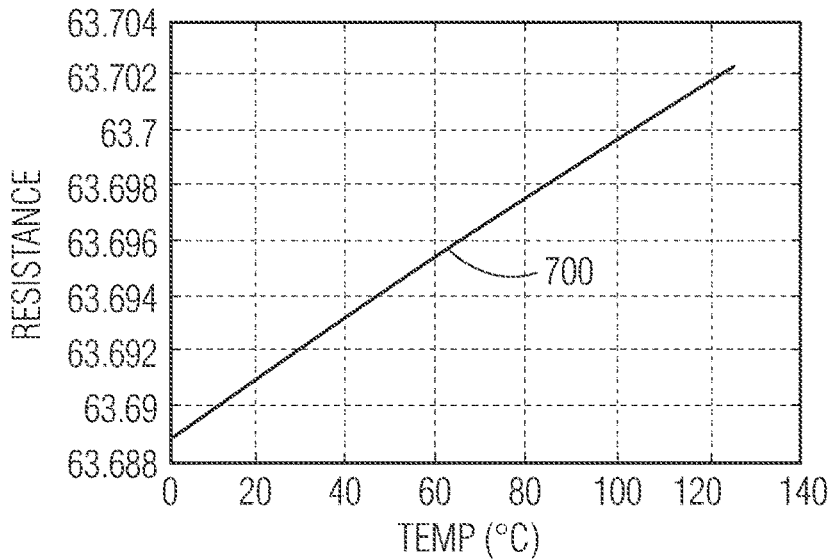
FIG. 7 illustrates an example of a resistance versus temperature curve for a process resistor coupled to an interconnect resistor.

FIG. 7 illustrates an example of a resistance versus temperature curve 700 for process resistor 132 coupled to interconnect resistor 134. The scale of the graph in FIG. 7 has been greatly increased compared to FIGS. 5 and 6 to show the combination of materials of which process resistor 132 and interconnect resistor 134 are made has a relatively flat or zero temperature coefficient. As indicated by curve 600, resistance at zero degrees Celsius is approximately 66.689 ohms and has negligible variation to a resistance of approximately 63.702 ohms at approximately 120 degrees Celsius. That is a difference of only 0.013 ohms over a 125 degrees Celsius range of temperature. In comparison, process resistor 132 varied by 4.8 ohms over a 126 degrees Celsius range, and interconnect resistor 134 varied by 3.4 ohms over the same temperature range.

By now it should be appreciated that in some embodiments there has been provided an integrated circuit that can include a driver having a first driver output, and a first resistance coupled between a first node coupled to the first driver output and a second node. The first resistance can include a process resistor including a first material having a first temperature coefficient, and an interconnect resistor configured to provide at least 20% of the first resistance and including a second material having a second temperature coefficient which changes resistance in an opposite direction with temperature as compared to the first temperature coefficient. A first terminal of the interconnect resistor is directly connected to a first terminal of the process resistor.

In another aspect, only the process resistor in combination with the interconnect resistor provides the first resistance between the first node and the second node.

In another aspect, the first driver output is a single-ended driver output and the second node is ground.

In another aspect, the process resistor comprises at least one of polysilicon, a semiconductor well region of the integrated circuit, or a diffusion region of the integrated circuit.

In another aspect, the interconnect resistor comprises a metal.

In another aspect, the process resistor is formed in a different layer of the integrated circuit than the interconnect resistor.

In another aspect, the interconnect resistor overlaps a majority of the process resistor.

In another aspect, the interconnect resistor is sized such that the second temperature coefficient compensates for the first temperature coefficient.

In another aspect, integrated circuit is devoid of active circuitry which provides temperature compensation for the process resistor.

In another aspect, the driver has a second driver output, and the integrated circuit can further comprise a second resistance coupled between the second node and a third node coupled to the second driver output. The second resistance can include a second process resistor including the first material, and a second interconnect resistor including the second material and configured to provide at least 20% of the second resistance. A first terminal of the second interconnect resistor can be directly connected to a first terminal of the second process resistor.

In another aspect, the second node can be coupled to a common output node corresponding to the first and second transmitter outputs.

In another aspect, a second terminal of the process resistor can be directly connected to the first node, and a second terminal of the second process resistor can be directly connected to the third node, and each of a second terminal of the first interconnect resistor and a second terminal of the second interconnect resistor can be directly connected to the second node.

In another aspect, the integrated circuit can further comprise a third interconnect resistor connected between the second node and the common output node. The third interconnect resistor can include the second material.

In another aspect, the first and second driver outputs provide a differential driver output.

In other selected embodiments, an integrated circuit can comprise a first node and a second node, and a resistance coupled between the first node and the second node. The resistance can include a process resistor configured to provide a first portion of the first resistance. A first terminal of the process resistor is connected directly to the first node and the process resistor can comprise a first material having a first temperature coefficient. An interconnect resistor can be configured to provide a second portion of the resistance. A first terminal of the interconnect resistor can be connected directly to a second terminal of the process resistor and a second terminal of the interconnect resistor can be connected directly to the second node. The interconnect resistor can comprise a second material having a second temperature coefficient which changes resistance in an opposite direction with temperature as compared to the first temperature coefficient. The process resistor and the interconnect resistor are configured to provide a total resistance between the first and the second node, wherein the second portion of the resistance can be at least 20% of the total resistance.

In another aspect, the process resistor can comprise at least one of polysilicon, a semiconductor well region of the integrated circuit, or a diffusion region of the integrated circuit.

In another aspect, the interconnect resistor can comprise a metal.

In another aspect, the process resistor can be formed in a different layer of the integrated circuit than the interconnect resistor.

In another aspect, the process resistor and the interconnect resistor can overlap.

In another aspect, the interconnect resistor can overlap a majority of the process resistor.

In another aspect, the interconnect resistor can be sized such that the second temperature coefficient compensates for the first temperature coefficient.

In another aspect, integrated circuit can be devoid of active circuitry to provide compensation for the process resistor.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, the temperature compensated resistance circuitry described herein can be used in driver circuits as well as any other IC devices that use termination resistors. While the provided embodiment illustrated a load terminated example, there are other termination techniques that could benefit from the temperature compensated resistance circuitry such as source or series terminations. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a driver having a first driver output and a second driver output;
   a first resistance coupled between a first node coupled to the first driver output and a second node, wherein the first resistance includes:
      a process resistor including a first material having a first temperature coefficient, and
      an interconnect resistor configured to provide at least 20% of the first resistance and including a second material having a second temperature coefficient which changes resistance in an opposite direction with temperature as compared to the first temperature coefficient, wherein a first terminal of the interconnect resistor is directly connected to a first terminal of the process resistor; and a second resistance coupled between the second node and a third node coupled to the second driver output, wherein the second resistance includes:
a second process resistor including the first material, and
a second interconnect resistor including the second material and configured to provide at least 20% of the second resistance, wherein a first terminal of the second interconnect resistor is directly connected to a first terminal of the second process resistor.

2. The integrated circuit of claim 1, wherein only the process resistor in combination with the interconnect resistor provides the first resistance between the first node and the second node.

3. The integrated circuit of claim 2, wherein the interconnect resistor comprises a metal.

4. The integrated circuit of claim 3, wherein the interconnect resistor overlaps a majority of the process resistor.

5. The integrated circuit of claim 1, wherein the first driver output is a single-ended driver output and the second node is ground.

6. The integrated circuit of claim 1, wherein the process resistor comprises at least one of polysilicon, a semiconductor well region of the integrated circuit, or a diffusion region of the integrated circuit.

7. The integrated circuit of claim 1, wherein the process resistor is formed in a different layer of the integrated circuit than the interconnect resistor.

8. The integrated circuit of claim 1, wherein the interconnect resistor is sized such that the second temperature coefficient compensates for the first temperature coefficient.

9. The integrated circuit of claim 8, wherein integrated circuit is devoid of active circuitry which provides temperature compensation for the process resistor.

10. The integrated circuit of claim 1, wherein the second node is coupled to a common output node corresponding to the first and second driver outputs.

11. The integrated circuit of claim 10, wherein a second terminal of the process resistor is directly connected to the first node, and a second terminal of the second process resistor is directly connected to the third node, and each of a second terminal of the interconnect resistor and a second terminal of the second interconnect resistor is directly connected to the second node.

12. The integrated circuit of claim 10, further comprising:
a third interconnect resistor connected between the second node and the common output node, wherein the third interconnect resistor includes the second material.

13. The integrated circuit of claim 10, wherein the first and second driver outputs provide a differential driver output.

14. An integrated circuit, comprising:
a first node and a second node and a third node, wherein the first node is coupled to a first driver circuit output and the third node is coupled to a second driver circuit output;
a resistance coupled between the first node and the second node, wherein the resistance includes:
a process resistor configured to provide a first portion of the first resistance, wherein a first terminal of the process resistor is connected directly to the first node, the process resistor comprising a first material having a first temperature coefficient, and
an interconnect resistor configured to provide a second portion of the resistance, wherein a first terminal of the interconnect resistor is connected directly to a second terminal of the process resistor and a second terminal of the interconnect resistor is connected directly to the second node, the interconnect resistor comprising a second material having a second temperature coefficient which changes resistance in an opposite direction with temperature as compared to the first temperature coefficient;
wherein the process resistor and the interconnect resistor are configured to provide a total resistance between the first and the second node, wherein the second portion of the resistance is at least 20% of the total resistance; and
a second resistance coupled between the second node and the third node, wherein the second resistance includes:
a second process resistor including the first material, and
a second interconnect resistor including the second material and configured to provide at least 20% of the second resistance, wherein a first terminal of the second interconnect resistor is directly connected to a first terminal of the second process resistor.

15. The integrated circuit of claim 14, wherein the process resistor comprises at least one of polysilicon, a semiconductor well region of the integrated circuit, or a diffusion region of the integrated circuit, and the interconnect resistor comprises a metal.

16. The integrated circuit of claim 14, wherein the process resistor is formed in a different layer of the integrated circuit than the interconnect resistor.

17. The integrated circuit of claim 16, wherein the interconnect resistor overlaps a majority of the process resistor.

18. The integrated circuit of claim 14, wherein the interconnect resistor is sized such that the second temperature coefficient compensates for the first temperature coefficient.

19. The integrated circuit of claim 18, wherein integrated circuit is devoid of active circuitry to provide temperature compensation for the process resistor.

* * * * *